United States Patent
Miyakawa

[11] Patent Number: 5,851,915
[45] Date of Patent: Dec. 22, 1998

[54] METHOD OF MANUFACTURING A SEMICONDUCTOR DEVICE THROUGH A REDUCED NUMBER OF SIMPLE PROCESSES AT A RELATIVELY LOW COST

[75] Inventor: Kuniko Miyakawa, Tokyo, Japan

[73] Assignee: NEC Corporation, Tokyo, Japan

[21] Appl. No.: 871,439

[22] Filed: Jun. 9, 1997

Related U.S. Application Data

[63] Continuation of Ser. No. 351,180, Nov. 30, 1994, abandoned.

[30] Foreign Application Priority Data

Nov. 30, 1993 [JP] Japan .................................. 5-300255

[51] Int. Cl.⁶ .............................................. H01L 21/4763
[52] U.S. Cl. ........................ 438/622; 438/660; 438/661; 438/663; 438/637; 438/666
[58] Field of Search ................................ 437/190, 192, 437/194, 195, 189–201, 947, 981, 644; 438/660, 661, 663, 622, 637, 666

[56] References Cited

U.S. PATENT DOCUMENTS

| | | | |
|---|---|---|---|
| 4,758,533 | 7/1988 | Magee et al. | 437/194 |
| 4,997,518 | 3/1991 | Madokoro | 437/190 |
| 5,124,780 | 6/1992 | Sandhu et al. | 357/67 |
| 5,173,442 | 12/1992 | Carey | 437/192 |
| 5,219,787 | 6/1993 | Carey et al. | 437/192 |
| 5,242,860 | 9/1993 | Nulman et al. | 437/190 |
| 5,244,837 | 9/1993 | Dennison | 437/195 |
| 5,248,628 | 9/1993 | Okabe et al. | 437/47 |
| 5,266,521 | 11/1993 | Lee et al. | 437/190 |
| 5,356,836 | 10/1994 | Chen et al. | 437/190 |
| 5,380,678 | 1/1995 | Yu et al. | 437/192 |
| 5,395,795 | 3/1995 | Hong et al. | 437/190 |
| 5,397,742 | 3/1995 | Kim | 437/190 |
| 5,451,543 | 9/1995 | Woo et al. | 437/190 |
| 5,468,684 | 11/1995 | Yoshimori et al. | 437/190 |
| 5,639,686 | 6/1997 | Hirano et al. | 438/396 |

FOREIGN PATENT DOCUMENTS

| | | | |
|---|---|---|---|
| 02794588 | 2/1988 | European Pat. Off. | 437/190 |
| 5-145061 | 6/1993 | Japan . | |
| 0661228 | 3/1994 | Japan | 437/190 |

OTHER PUBLICATIONS

Wolf et al., Silicon Processing For The VLSI Era, vol. II, Lattice Press, 1990, pp. 273–285.

"High Density Damascene Wiring and Borderless Contacts for 64 m DRAM," by S. Roehl et al., VMIC Conference, Jun. 9–10, 1992, pp. 22–28.

Primary Examiner—John F. Niebling
Assistant Examiner—Lynne A. Gurley
Attorney, Agent, or Firm—Foley & Lardner

[57] ABSTRACT

In a method of manufacturing a semiconductor device including a first and a second insulator film and a first and a second conductive layer held to the first and said second insulator films, respectively. The first insulator film is formed to have a first wiring trench along an upper surface of the first insulator film and a first through hole extending from the first wiring trench to a lower surface of the first insulator film. A first conductive material is deposited on the upper surface of the first insulator film to fill the first wiring trench and the first through hole. Thereafter, the first conductive material is partially removed to have an upper surface coplanar with the upper surface of the first insulator film. As a result, the first conductive material becomes the first wiring layer. Next, the second insulator film and the second wiring layer are formed in the manner which is similar to that of forming the first insulator film and the first wiring layer.

21 Claims, 8 Drawing Sheets

METHOD OF MANUFACTURING A SEMICONDUCTOR DEVICE THROUGH A REDUCED NUMBER OF SIMPLE PROCESSES AT A RELATIVELY LOW COST

This application is a continuation of application Ser. No. 08/351,180, filed Nov. 30, 1994 now abandoned.

BACKGROUND OF THE INVENTION

This invention relates to a method of manufacturing a semiconductor device including a plurality of film members and a plurality of wiring layers held to the film members, respectively.

Such a semiconductor device is manufactured in a first conventional method which will be described in the following. An insulator film is prepared. An Al alloy film and a high-melting point metal film are successively deposited on the insulator film by sputtering. In a start of a process of the conventional method, the Al alloy film and the high-melting point metal film are patterned to form a wiring layer or an underlying wiring layer on the insulator film. Another insulator film is deposited on the insulator film to cover the wiring layer. Spin-on-glass coating is repeatedly applied on the other insulator film. In the manner known in the art, an etchback process is carried out to form on the insulator film with a film member to which the wiring layer is held. The film member is made with a through hole. In addition, another Al alloy film and another high-melting point metal film are deposited on the film member by sputtering in order to form another wiring layer or an overlying wiring layer. Thereafter, a similar process is repeatedly carried out to provide a multilevel wiring structure.

In the conventional method, electrical connection is often interrupted in a particular case where the through hole has an aspect ratio which is relatively large. This is because a conventional sputtering technique is not sufficient in the particular case as regards a coverage known in the art.

Under the circumstances, the conventional method is improved upon manufacturing a highly integrated device to have a particular process which will be described in the following. A W film is deposited after the through hole is made. After the W film is etched back to form a W plug, the Al alloy film and the high-melting point metal film are formed by sputtering and deposition to provide the overlying wiring layer.

However, it is difficult to interpose the insulator film between the underlying and the overlying wiring layers at a reduced wiring pitch required in the highly integrated device. In order to avoid an increase of a line resistance of each of the wiring layers, the thickness of each of the wiring layers can not be reduced. As a consequence, each of the wiring layers has a rectangular section elongated in a vertical direction. This results in heavy undulation of a surface of the film member. When the metal film is deposited on such wiring layer with the heavy undulation in order to form the other wiring layer, the metal film often becomes thin at an area where the underlying wiring layer has a step portion which is relatively great. In a worst case, the metal film is interrupted. It is therefore necessary to form a planarized interlayer film between the overlying and the underlying wiring layers. This repeatedly requires the spin-on-glass coating and the etchback process. With an increase of a number of the wiring layers, a large number of processes are inevitably required.

Proposal is made of a second conventional method which adopts a trench wiring structure and a polishing technique. The method is disclosed in a paper written by S. Roehl et al and contributed to transactions on 1992 VMIC Conference (Jun. 9–10, 1992), pages 22–28. The method will far later be discussed in detail in conjunction with the drawing.

However, the second conventional method inevitably requires an increased number of complicated processes and an increased cost.

SUMMARY OF THE INVENTION

It is therefore an object of this invention to provide a method of manufacturing a semiconductor device, which is carried out through a reduced number of simple processes at a relatively low cost.

Other objects of this invention will become clear as the description proceeds.

According to an aspect of this invention, there is provided a method of manufacturing a semiconductor device including a first and a second insulator film and a first and a second conductive layer held to the first and the second insulator films, respectively. The first insulator film is defined between a first main and a first supplementary surface opposite to each other. The second insulator film is defined between a second main surface facing the first supplementary surface and a second supplementary surface opposite to the second main surface. The method comprises the steps of forming the first insulator film to have a first wiring trench along the first supplementary surface and a first through hole extending from the first wiring trench to the first main surface, depositing a first conductive material on the first insulator film to have a first inner portion in the first wiring trench and the first through hole and a first outer portion on the first supplementary surface, removing the first outer portion to make the first inner portion be the first wiring layer, forming the second insulator film on the first supplementary surface to have a second wiring trench along the second supplementary surface and a second through hole extending from the second wiring trench to the first wiring layer, depositing a second conductive material on the second insulator film to have a second inner portion in the second wiring trench and the second through hole and a second outer portion on the second supplementary surface, and removing the second outer portion to make the second inner portion be the second wiring layer.

According to another aspect of this invention, there is provided a method of manufacturing a semiconductor device including an N number of insulator films superposed one another and wiring layers held to the insulator films, respectively, where N is an integer. Each of the insulator films having a main and a supplementary surface opposite to each other. The method comprises the steps of forming one of the insulator films to have a wiring trench along the supplementary surface and a through hole extending from the wiring trench to the main surface, depositing a conductive material on the one of the insulator films to have an inner portion in the wiring trench and the through hole and an outer portion on the supplementary surface, removing the outer portion to make the inner portion be one of the wiring layers, and repeatedly carrying out (N−1) times a set of the forming, the depositing, and the removing steps.

DETAILED DESCRIPTION OF THE INVENTION

Referring to FIGS. 1(a)–1(e), description will at first be made as regards a conventional method for a better understanding of this invention. The conventional method is of manufacturing a semiconductor device having a conventional wiring structure and corresponds to the second conventional method that is described in the background.

Figure 1A:
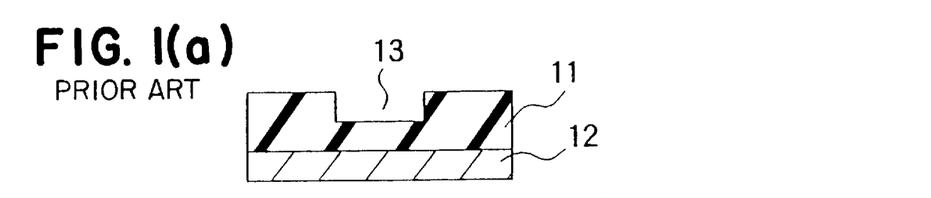
FIGS. 1(a)–1(e) are sectional views for describing a conventional method of manufacturing a semiconductor device.

Referring to FIG. 1(a), a first insulator film 11 is deposited on a silicon substrate 12. A first wiring trench 13 is formed in the first insulator film 11.

Figure 1B:
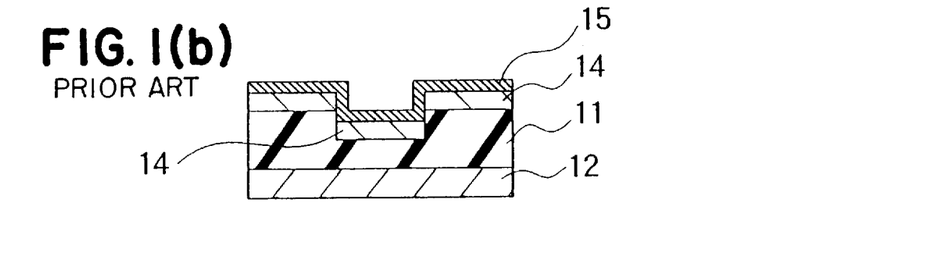

Turning to FIG. 1(b), a first conductive film 14 of Al is formed by collimated sputtering to fill the first wiring trench 13. Then, a second conductive film 15 of W is deposited on the first conductive film 14. During a subsequent polishing process, the second conductive film 15 serves to avoid smearing, scratching, and corrosion of a surface of the first conductive film 14 and to suppress pattern-dependent depression of the surface.

Figure 1C:
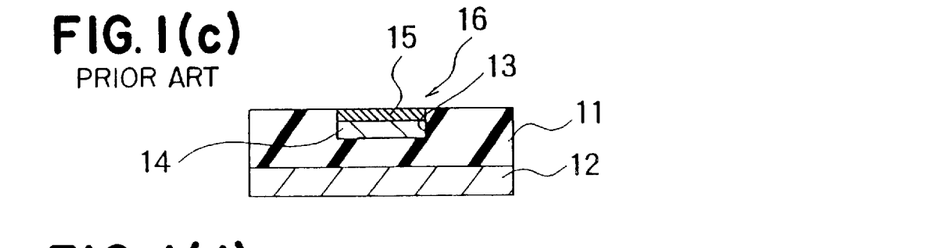

After the second conductive film 15 is deposited on the first conductive film 14, polishing is carried out to remove the second conductive film 15 and the first conductive film 14 on the first insulator film 11 except those portions within the first wiring trench 13, as illustrated in FIG. 1(c). As a result, the first insulator film 11 and the second conductive film 15 have upper surfaces which will collectively be called a polished surface. Thus, a trench wiring structure 16 of an embedded type is obtained.

Figure 1D:
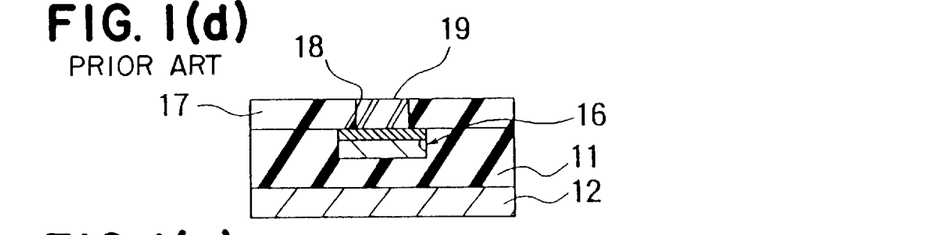

Turning to FIG. 1(d), a second insulator film 17 is deposited on the first insulator film 11 to cover the trench wiring structure 16. A through hole 18 is made to the second insulator film 17 to reach the trench wiring structure 16. A plug 19 of W is formed in the through hole 18. In this connection, W has a resistance higher than that of Al.

Figure 1E:
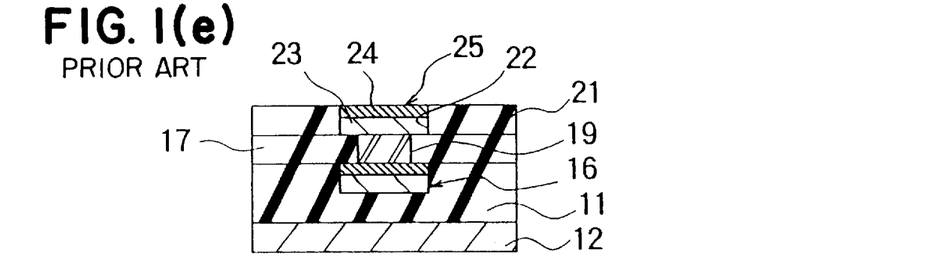

Turning to FIG. 1(e), a third insulator film 21 is deposited on the second insulator film 17 to cover the plug 19. A second wiring trench 22 is made to the third insulator film 21. By collimated sputtering, a third conductive film 23 of Al is formed to fill the second wiring trench 22. A fourth conductive film 24 of W is formed on the third conductive film 23. Then, polishing is carried out to produce an overlying wiring layer 25 which is connected to the trench wiring layer 16 through the plug 19.

However, the collimated sputtering has a sputtering rate equal to about 1/10 of ordinary or uncollimated sputtering and is inferior in efficiency. In addition, use of the plug 19 renders the process to be complicated. Since the through hole 18 can not be successfully filled with Al by the collimated sputtering in a case where the through hole 18 has an aspect ratio relatively high, use is made of a CVD method using W. This makes the process become further complicated. The plug 19 is brought into contact with the polished surface. In this situation, there arises another problem of high contact resistance due to a roughness of the polishing surface.

Figure 2A:
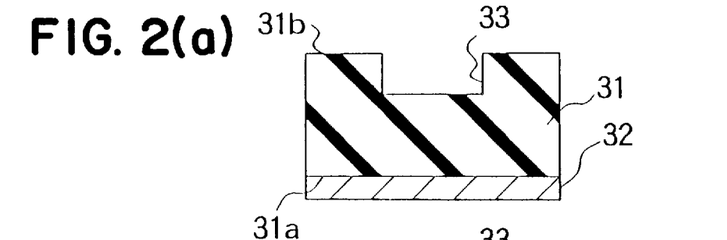
FIGS. 2(a)–2(i) are sectional views for describing a method according to a first embodiment of this invention.

Turning to FIGS. 2(a)–2(i), the description will now be directed to a method according to a first embodiment of this invention. The method is of manufacturing a semiconductor device comprising a wiring structure having a first and a second wiring layer. Referring to FIG. 2(a), a first insulator film 31 is deposited on a silicon substrate 32 in which a source electrode and a drain electrode (not shown) are formed. The first insulator film 31 extends between first main and first supplementary surfaces 31a and 31b which are opposite to each other. After the first supplementary surface 31b is planarized, the first insulator film 31 is provided with a first wiring trench 33 at the first supplementary surface 31b. The first wiring trench 33 has a first trench-inner surface.

Figure 2B:
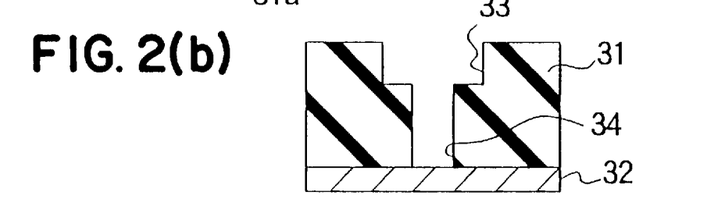

Turning to FIG. 2(b), a first through hole 34 is made through the first insulator film 31 to extend from a bottom of the first wiring trench 33 to the silicon substrate 32. The first through hole 34 has a first hole-inner surface.

Figure 2C:
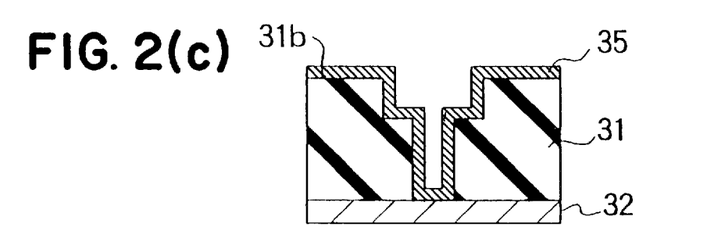

Turning to FIG. 2(c), TiN and Ti are deposited as a first conductive barrier film 35 on the first insulator film 31 by collimated sputtering to have a thickness of 500 and 300 angstroms, respectively. In this event, the first conductive barrier film 35 is formed on each of the first supplementary surface 31b, the first trench-inner surface, and the first hole-inner surface.

Figure 2D:
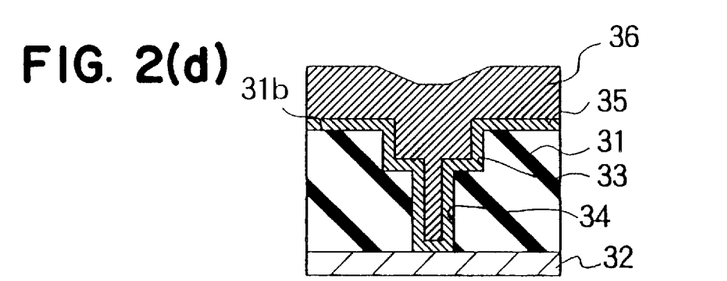

Turning to FIG. 2(d), pure Al is deposited as a first conductive metal layer 36 on the first conductive barrier film 35 at a room temperature to have a thickness of 5500 angstroms. After the first conductive metal layer 36 is formed, the silicon substrate 32 or the first conductive metal layer 36 is heated to a first reflowing temperature of 460° C. This results in reflowing of Al as known in the art. The reflowing causes the pure Al sufficiently and simultaneously to be filled in the first wiring trench 33 and the first through hole 34. A combination of the first conductive barrier film 35 and the first conductive metal layer 36 is referred to as a first conductive material. The first conductive material comprises a first inner portion in the first wiring trench 33 and the first through hole 34 and a first outer portion on the first supplementary surface 31b.

Figure 2E:
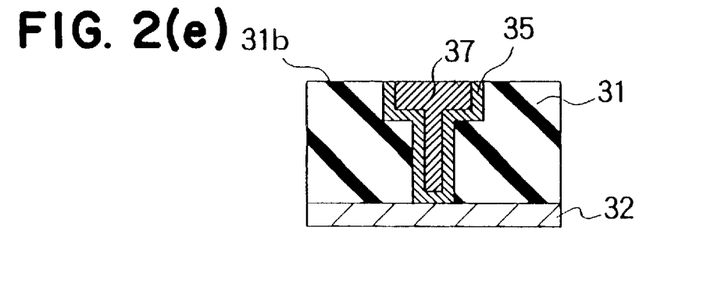

Turning to FIG. 2(e), the first conductive material is removed with the first outer portion by polishing to become substantially coplanar with the first supplementary surface 31b. The polishing is carried out by the use of an abrasive under the condition of a rotation speed of 35 rpm, a load of 70 kg/cm², and a polishing rate of about 2000 A/min. In this event, a first shaped layer 37 is produced to have a polished surface substantially planarized. A combination of the first conductive barrier film 35 and the first shaped layer 37 is referred to as the first wiring layer. In this connection, the first wiring layer comprises a first wire portion in the first wiring trench 33 and a first connecting portion in the first through hole 34.

Figure 2F:
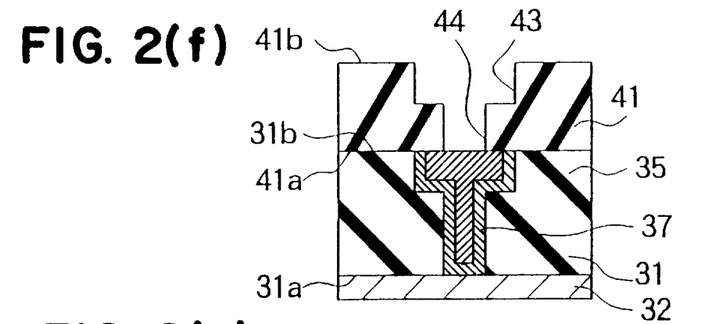

Turning to FIG. 2(f), a second insulator film 41 is deposited on the first insulator film 31 and the first wiring layer by a single step to have a thickness of 8000 angstroms. The second insulator film 41 extends between a second main surface 41a facing the first supplementary surface 31b and a second supplementary surface 41b opposite to the second main surface 41a. After the second supplementary surface 41b is planarized, the second insulator film 41 is provided with a second wiring trench 43 at the second supplementary surface 41b in alignment with the first wiring trench 33. The second wiring trench 43 has a second trench-inner surface. In addition, a second through hole 44 is made through the second insulator film 41 to extend from a bottom of the second wiring trench 43 to the first shaped layer 37 in alignment with the first through hole 34. The second through hole 44 has a second hole-inner surface.

Figure 2G:
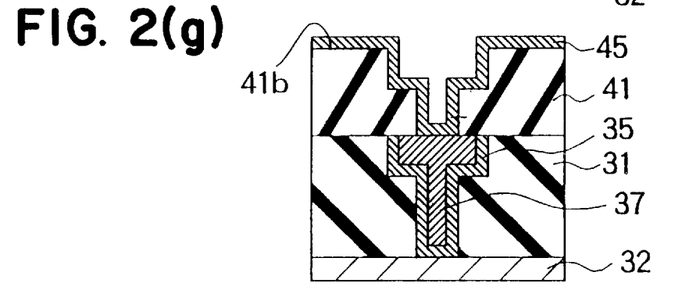

Turning to FIG. 2(g), TiN and Ti are deposited as a second conductive barrier film 45 on the second insulator film 41 by collimated sputtering to have a thickness of 300 and 100 angstroms, respectively. In this event, the second conductive barrier film 45 is formed on each of the second supplementary surface 41b, the second trench-inner surface, and the second hole-inner surface.

Figure 2H:
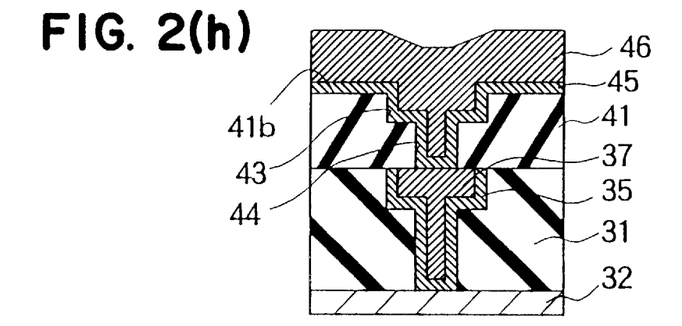

Turning to FIG. 2(h), pure Al is deposited as a second conductive metal layer 46 on the second conductive barrier film 45 at a room temperature to have a thickness of 5500 angstroms. After the second conductive metal layer 46 is formed, the silicon substrate 32 or the second conductive metal layer 46 is heated to a reflowing temperature of 460° C. which is equal to the first reflowing temperature and will be called herein a second reflowing temperature. This results in the reflowing of Al to cause the pure Al sufficiently and simultaneously to be filled in the second wiring trench 43 and the second through hole 44. A combination of the second conductive barrier film 45 and the second conductive metal layer 46 is referred to as a second conductive material. The second conductive material comprises a second inner portion in the second wiring trench 43 and the second through hole 44 and a second outer portion on the second supplementary surface 41b.

Figure 2I:
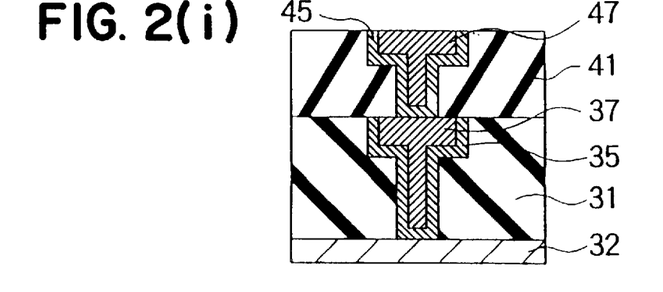

Turning to FIG. 2(i), the second conductive material is removed with the second outer portion by the above-mentioned polishing to become substantially coplanar with the second planarized surface. In this event, a second shaped layer 47 is produced to have a surface substantially planarized. A combination of the second conductive barrier film 45 and the second shaped layer 47 is referred to as the second wiring layer. In this connection, the second wiring layer comprises a second wire portion in the second wiring trench 43 and a second connecting portion in the second through hole 44.

Referring to FIGS. 3(a)–3(i), the description will be made as regards a second embodiment of this invention. The method is of manufacturing the semiconductor device that comprises the wiring structure having the first and the second wiring layers. The method comprises steps which are illustrated in FIGS. 3(a)–3(f) and corresponds to that illustrated in FIGS. 2(a)–2(f). Similar parts are designated by like reference numerals.

Figure 3A:
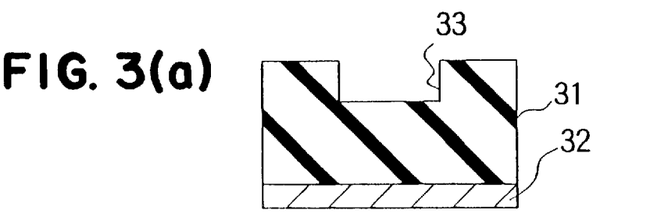
FIGS. 3(a)–3(i) are sectional views for describing a method according to a second embodiment of this invention.
Figure 3B:
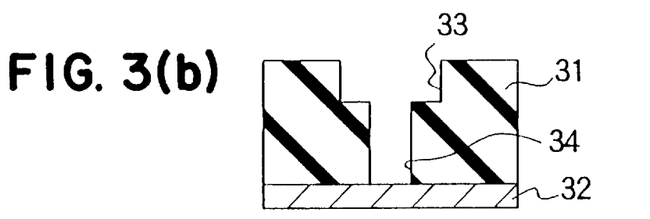
Figure 3C:
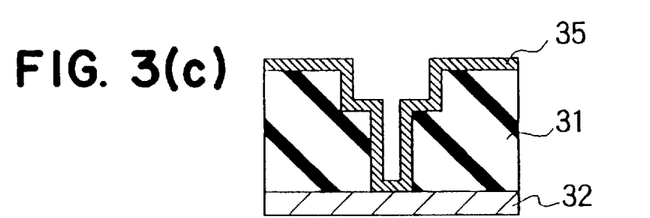
Figure 3D:
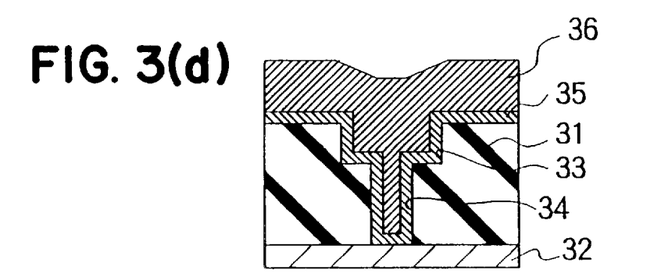
Figure 3E:
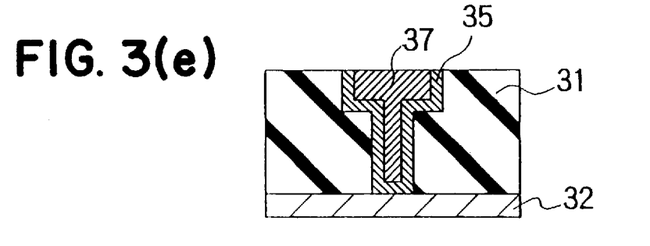
Figure 3F:
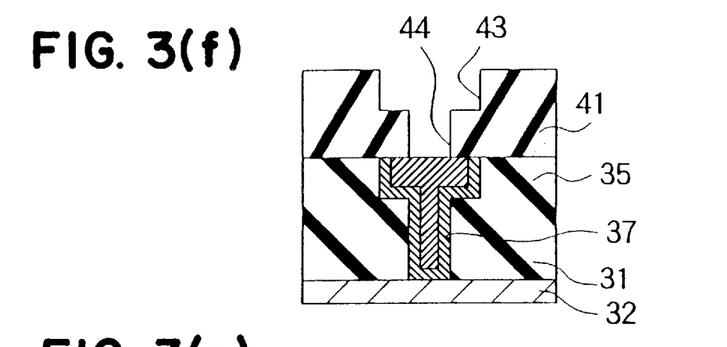
Figure 3G:
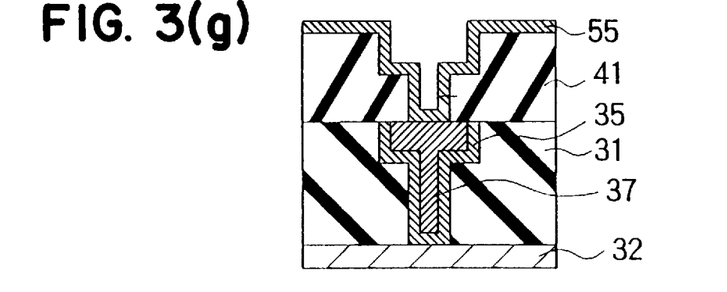
Figure 3H:
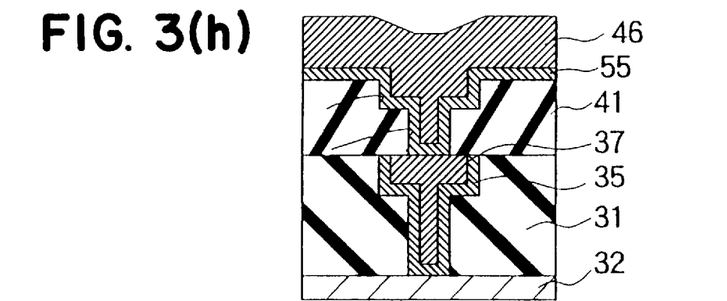
Figure 3I:
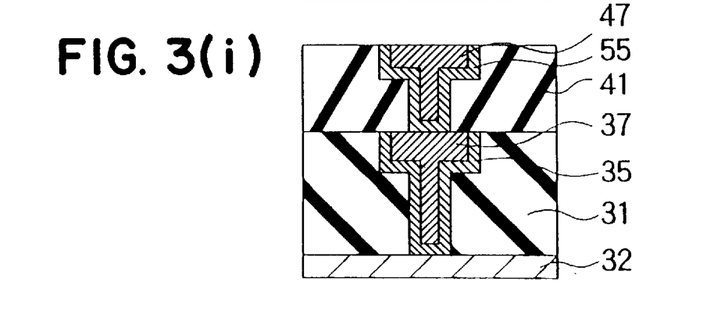

Referring to FIGS. 3(g), Ti is deposited to form a liner film 55 on the second insulator film 41 by collimated sputtering. The liner film 55 has a thickness of 100 angstroms and corresponds to the second conductive barrier film. An Al alloy is deposited to form the second conductive metal layer 46 on the liner film 55 at a room temperature. The second conductive metal layer 46 has a thickness of 5500 angstroms. The Al alloy contains 1% Ge and 0.5% Cu. The reflowing of the Al alloy is carried out at the second reflowing temperature of 410° C. for 180 seconds with vacuum maintained. Such an Al alloy has a relatively low eutectic temperature and is disclosed as an example in Japanese Patent Publication No. 145061/1993 by Kuniko Miyakawa, the present applicant. As compared with a conventional Al—Si alloy, the second reflowing temperature of the example can be lowered to a level at which the first wiring layer is not damaged. After reflowing of the Al alloy, the polishing is performed as regards the second conductive metal layer 46 in the manner similar to the first conductive metal layer 36. A combination of the second conductive metal layer 46 and the liner film 55 is referred to as the second wiring layer.

Figure 4:
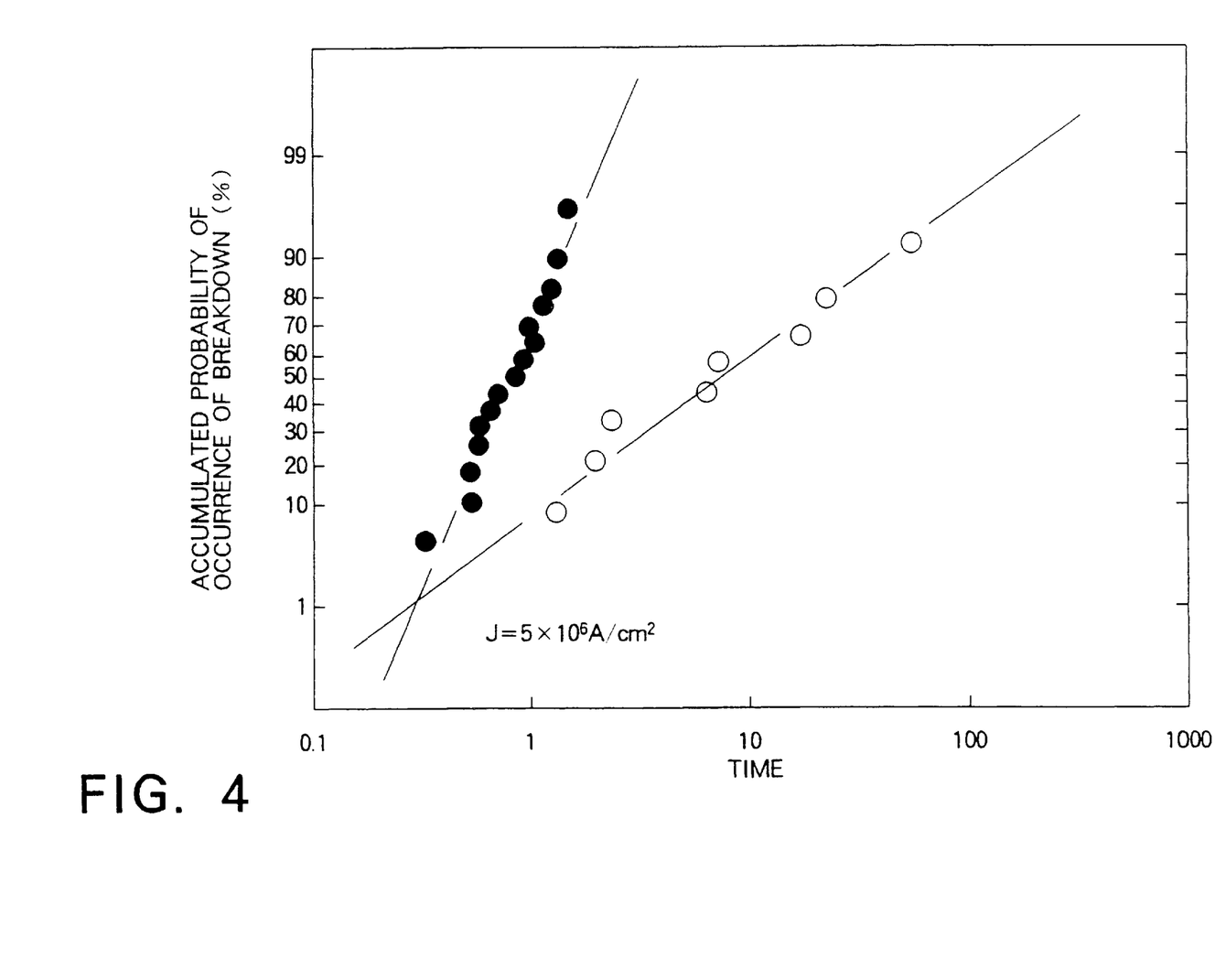
FIG. 4 is a graph for comparing lifetime of a wire portion between the method of FIGS. 1(a)–1(e) and the method of FIGS. 2(a)–2(i) with respect to electromigration.

Turning to FIG. 4, the description will be directed to reliability of the wiring structure. In FIG. 4, white circles represent a case of the method of FIGS. 2(a)–2(i). Black circles represent a case of the method of FIGS. 1(a)–1(i). In each of the methods described in conjunction with FIGS. 2(a)–2(i) and 3(a)–3(i), no stress is imposed on each of the first and the second wiring layers. Therefore, reliability is remarkably improved. Practically, each of the first and the second wiring layers has electromigration resistance which is improved up to about five times as compared with the conventional wiring layer. Therefore, accumulated probability of occurrence of breakdown is improved as will become clear from FIG. 4.

Inasmuch as the first and the second through holes are filled by sputtering of the Al or the Al alloy, a crystal grain size is great in those holes. Therefore, occurrence of interruption is reduced. In addition, deterioration of reliability due to insufficient coverage is avoided also. Thus, it is possible to manufacture the semiconductor device that is highly reliable.

Figure 5:
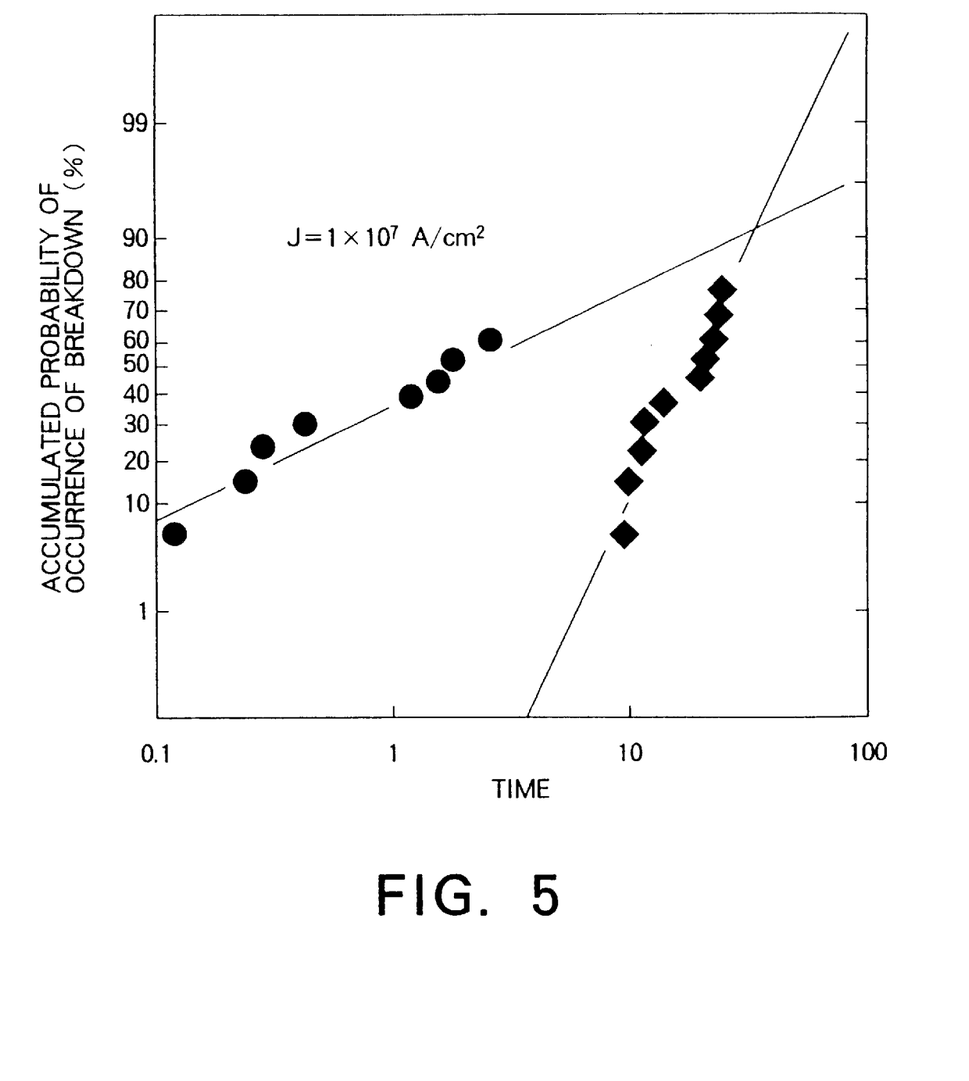
FIG. 5 is a graph for comparing lifetime of a contact portion between the method of FIGS. 1(a)–1(e) and the method of FIGS. 2(a)–2(i) with respect to the electromigration.

Turning to FIG. 5, the description will be directed to span of life of the wiring structure. In FIG. 5, black circles represent a case using the reflowing, black squares representing a case using only sputtering. As will become clear from FIG. 5, the span of the life of the wiring structure is extended up to nine times by the use of the reflowing as compared with the use of only one sputtering. The reflowing is effective in the following respects. First, upon contact with a polished surface of the first wiring layer, roughness due to the polishing is recovered as regards the polished surface. Second, contact resistance is rendered constant and reduced by mixing metal materials.

Figure 6:
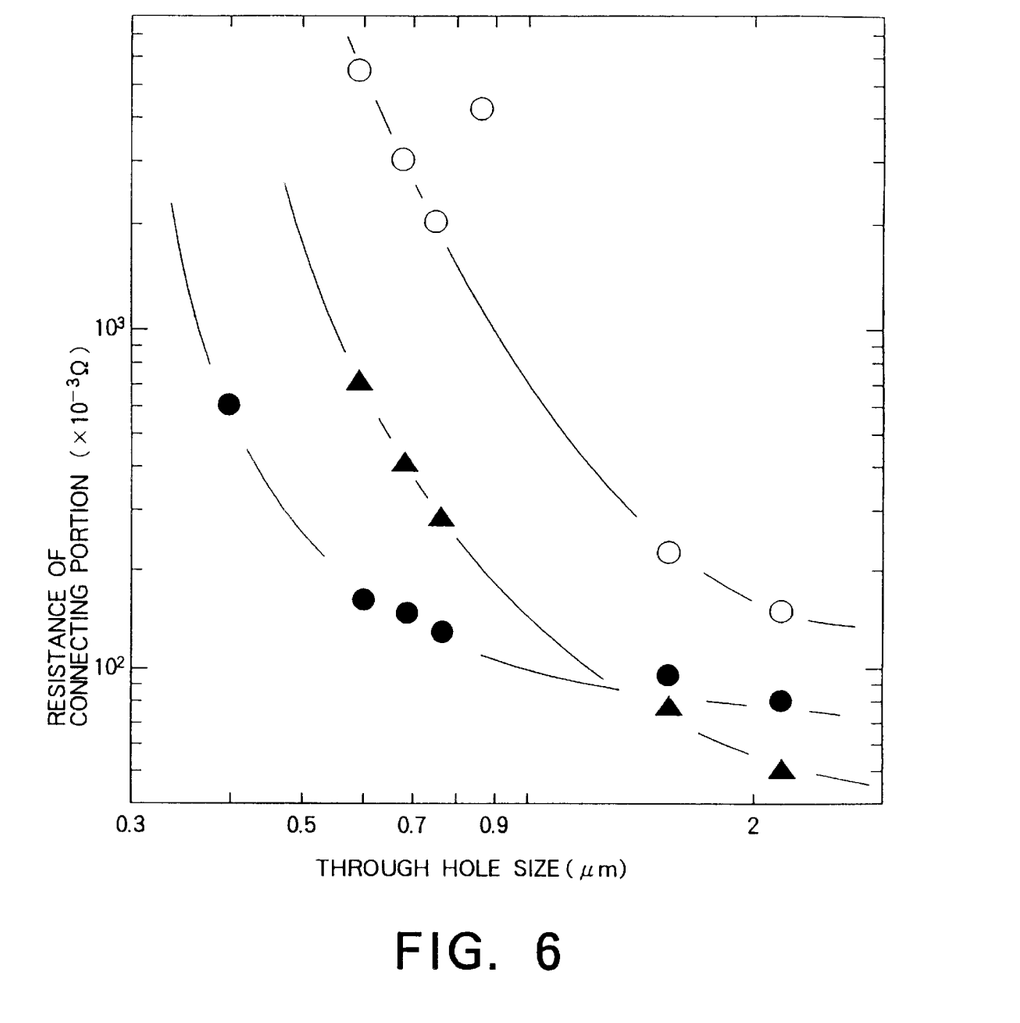
FIG. 6 is a graph for comparing resistance of the through hole portion among three different structures.

Turning to FIG. 6, the description will be directed to electrical resistance of the connecting portion of the wiring structure. In FIG. 6, black circles represent a first case where the reflowing is applied to each of the first and the second wiring layers. White circles represent a second case where reflowing is applied to only the first wiring layer while the second wiring layer is formed by the conventional method. Black triangles represent a third case where each of the first and the second wiring layers is formed by the conventional method. With the first case, the second connecting portion of the second wiring layer has electrical resistance remarkably reduced relative to each of the second and the third cases. Specifically, for the second connecting portion having a diameter of 0.6 micrometers, the electrical resistance of the second connection portion is reduced down to about 160 megohms corresponding to about ¼ of the resistance in the second case. In addition, planarization is achieved by a single polishing step. It is therefore possible to remarkably reduce a number of processes and to reduce the cost.

While the present invention has thus far been described in connection with a few embodiments thereof, it will readily be possible for those skilled in the art to put this invention into practice in various other manners. For example, the first conductive metal layer may be made of one of an Al—Si alloy and an Al—Si—Cu alloy. The first and the second conductive barrier films may be made of one of high-melting point metal, transition metal, or silicide, nitride, and boronite thereof. The first and the second conductive barrier films may be formed by chemical vapor deposition (CVD) instead of the collimated sputtering. Each of the first and the second conductive barrier films can be omitted as far as reliability of the semiconductor device is assured. On making each of the first and the second through holes, an etch stop having a high etching selection ratio with respect to an oxide film may preliminarily be formed before each of the first and the second wiring trenches is formed. In this event, a self-alignment structure is obtained where the first and the second through holes are automatically aligned with respect to a wiring pattern. Thus, no consideration is required as regards a margin. Although the description is made as regards the wiring structure comprising two insulator films, the present invention can be applied to another wiring structure comprising three more insulator films.

What is claimed is:

1. A method of manufacturing a semiconductor device including first and second insulator films and first and second wiring layers formed on said first and second insulator films, respectively, said first insulator film extending between first main and first supplementary surfaces opposite each other, said second insulator film extending between a second main surface facing said first supplementary surface and a second supplementary surface opposite said second main surface, said method comprising, in the order recited, the steps of:
    (a) forming a first insulator film extending between first main and first supplementary surfaces opposite each other;
    (b) forming a first wiring trench along said first supplementary surface of said first insulator film;
    (c) forming a first through hole extending from said first wiring trench to said first main surface;
    (d) depositing a first inner portion of a first conductive material in said first wiring trench and said first through hole of said first insulator film and a first outer portion of the first conductive material on said first supplementary surface;
    (e) removing said first outer portion by polishing and leaving said first inner portion to form a first wiring layer;
    (f) forming a second insulator film on said first supplementary surface, said second insulator film extending between a second main surface facing said first supplementary surface and a second supplementary surface opposite said second main surface;
    (g) forming a second wiring trench along said second supplementary surface of said second insulator film in alignment with said first wiring trench;
    (h) forming a second through hole extending from said second wiring trench to said first wiring layer in alignment with said first through hole;
    (i) depositing a second inner portion of a second conductive material in said second wiring trench and said second through hole of said second insulator film with said second inner portion in contact with said first wiring layer, and a second outer portion of the second conductive material on said second supplementary surface;
    (j) exposing said first wiring layer and said second conductive material to a temperature at which reflowing of each of said first wiring layer and said second conductive material occurs to place said second inner portion in close contact with said first wiring layer; and
    (k) removing said second outer portion by polishing and leaving said second inner portion to form a second wiring layer.

2. A method as claimed in claim 1, further comprising the step of:
    (1) between said steps (d) and (e), exposing said first conductive material to a temperature at which reflowing of said first conductive material is caused.

3. A method as claimed in claim 2, wherein said temperature to which said first conductive material is exposed in said step (1) is equal to said temperature to which said first wiring layer and said second conductive material are exposed in said step (j).

4. A method as claimed in claim 2, wherein said temperature to which said first conductive material is exposed in said step (1) is higher than said temperature to which said first wiring layer and said second conductive material are exposed in said step (j).

5. A method as claimed in claim 2, wherein said temperature to which said first conductive material is exposed in said step (1) is between 400° C. and 500° C.

6. A method as claimed in claim 2, wherein in said step (b), said first wiring trench is formed having a first trench-inner surface, and in said step (c), said first through hole is formed having a first hole-inner surface, and wherein said step (d) comprises the steps of:
    (1) forming a first conductive barrier film on said first trench-inner, said first hole-inner, and said first supplementary surfaces; and
    (2) sputtering to deposit a first conductive metal layer on said first conductive film, said first conductive barrier film and said first conductive metal layer in combination serving as said first conductive material.

7. A method as claimed in claim 6, wherein said sputtering step (d)(2) is carried out at a room temperature which is lower than said temperatures to which said first conductive material is exposed in said step (1) and to which said first wiring layer and said second conductive material are exposed in said step (j).

8. A method as claimed in claim 6, wherein said forming step (d)(1) is carried out by sputtering of one of a high-melting point material and a silicide material.

9. A method as claimed in claim 6, wherein said forming step (d)(1) is carried out by chemical vapor deposition of one of a high-melting point material and a silicide material.

10. A method as claimed in claim 2, wherein in said step (g), said second wiring trench is formed having a second trench-inner surface, and in said step (h), said second through hole is formed having a second hole-inner surface, and wherein said step (i) comprises the steps of:
    (1) forming a second conductive barrier film on said second trench-inner, said second hole-inner, and said second supplementary surfaces; and
    (2) sputtering to deposit a second conductive metal layer on said second conductive film, said second conductive barrier film and said second conductive metal layer in combination serving as said second conductive material.

11. A method as claimed in claim 10, wherein said sputtering step (i)(2) is carried out at a room temperature which is lower than said temperatures to which said first conductive material is exposed in said step (1) and to which said first wiring layer and said second conductive material are exposed in said step (j).

12. A method as claimed in claim 10, wherein said forming step (i)(1) is carried out by sputtering of one of a high-melting point material and a silicide material.

13. A method as claimed in claim 10, wherein said forming step (i)(1) is carried out by chemical vapor deposition of one of a high-melting point material and a silicide material.

14. A method as claimed in claim 2, wherein the steps (d) and (i) of depositing include the step of depositing an aluminum layer and the steps (1) and (j) of exposing include the step of exposing the first and second conductive materials to a temperature between 410° C. and 500° C.

15. A method as claimed in claim 1, wherein said removing step (e) comprises polishing said first conductive material to become coplanar with said first supplementary surface.

16. A method as claimed in claim 1, wherein said removing step (k) comprises polishing said second conductive material to become coplanar with said second supplementary surface.

17. A method of manufacturing a semiconductor device including a number N of insulator films superposed one on another and a number N of wiring layers formed on said insulator films, respectively, where N is an integer and is at least two, each of said insulator films having main and supplementary surfaces opposite each other, wherein said method comprises, in the order recited, the steps of:

(a) forming an insulator film extending between main and supplementary surfaces opposite each other;

(b) forming a wiring trench along said supplementary surface of said insulator film;

(c) forming a through hole extending from said wiring trench to said main surface;

(d) depositing an inner portion of a conductive material in said wiring trench and said through hole of said insulator film and an outer portion of the conductive material on said supplementary surface;

(e) exposing said conductive material to a temperature at which reflowing of said conductive material and a wiring layer of a previous layer (if any) occur;

(f) removing said outer portion by polishing and leaving said inner portion to form a wiring layer;

(g) repeating said steps (a)–(f) (N–1) times.

18. A method of manufacturing a semiconductor device, comprising the steps of:

forming a first insulator film on a semiconductor substrate;

forming a first wiring trench along a surface of the first insulator film;

forming a first through hole extending from the first wiring trench to the semiconductor substrate to expose a portion of the semiconductor substrate;

depositing a first conductive barrier film on the first insulator film and the exposed portion of the semiconductor substrate;

depositing a first conductive metal layer on the first conductive barrier film;

heating the semiconductor substrate to a reflowing temperature of the first conductive metal layer;

polishing the first conductive metal layer and the first conductive barrier film to form a first wiring layer;

forming a second insulator film on the first wiring layer;

forming a second wiring trench along a surface of the second insulator film;

forming a second through hole extending from the second wiring trench to the first wiring layer to expose a portion of the first wiring layer;

depositing a second conductive barrier film on the second insulator film and the exposed portion of the first wiring layer;

depositing a second conductive metal layer on the second conductive barrier film;

heating the semiconductor substrate to a reflowing temperature of the second conductive metal layer; and polishing the second conductive metal layer and the second conductive barrier film to form a second wiring layer.

19. A method as claimed in claim 18, wherein the step of depositing the first conductive metal layer includes the step of depositing an aluminum layer and the step of heating the semiconductor substrate to the reflowing temperature of the first conductive metal layer includes the step of heating the semiconductor substrate to a temperature of 460° C.

20. A method as claimed in claim 19, wherein the step of depositing the second conductive metal layer includes the step of depositing an aluminum alloy layer and the step of heating the semiconductor substrate to the reflowing temperature of the second conductive metal layer includes the step of heating the semiconductor substrate in vacuum to a reflowing temperature that is less than that of the first conductive layer.

21. A method as claimed in claim 20, wherein the step of heating the semiconductor substrate in vacuum includes the step of heating the semiconductor substrate to a temperature of 410° C.

* * * * *